(12) United States Patent
Chen et al.

(10) Patent No.: US 9,847,138 B2
(45) Date of Patent: Dec. 19, 2017

(54) SHIFT REGISTER

(71) Applicant: AU OPTRONICS CORP., Hsinchu (TW)

(72) Inventors: Pei-Hua Chen, Hsin-Chu (TW); Yu-Hsin Ting, Hsin-Chu (TW); Chung-Lin Fu, Hsin-Chu (TW); Tsao-Wen Lu, Hsin-Chu (TW); Nan-Ying Lin, Hsin-Chu (TW); Wei-Chun Hsu, Hsin-Chu (TW)

(73) Assignee: AU OPTRONICS CORP., Hsinchu (TW)

( * ) Notice: Subject to any disclaimer, the term of this patent is extended or adjusted under 35 U.S.C. 154(b) by 36 days.

(21) Appl. No.: 15/061,160

(22) Filed: Mar. 4, 2016

(65) Prior Publication Data

US 2016/0189798 A1 Jun. 30, 2016

Related U.S. Application Data

(63) Continuation of application No. 13/661,239, filed on Oct. 26, 2012, now Pat. No. 9,318,064.

(30) Foreign Application Priority Data

Dec. 5, 2011 (TW) .............................. 100144677 A

(51) Int. Cl.
*G09G 3/36* (2006.01)
*G11C 19/28* (2006.01)
(Continued)

(52) U.S. Cl.
CPC .......... *G11C 19/28* (2013.01); *G09G 3/3648* (2013.01); *G09G 3/3677* (2013.01); *G09G 3/38* (2013.01);
(Continued)

(58) Field of Classification Search
CPC ............. G09G 3/36; G09G 3/38; G11C 19/00
(Continued)

(56) References Cited

U.S. PATENT DOCUMENTS

| | | | |
|---|---|---|---|
| 6,778,627 B2 * | 8/2004 | Yu | ........................ G11C 19/184 345/100 |
| 6,885,723 B2 | 4/2005 | Yu | |

(Continued)

FOREIGN PATENT DOCUMENTS

| | | | | |
|---|---|---|---|---|
| CN | 102184697 | * | 9/2011 | ............... G09G 3/20 |
| TW | 201015512 | | 4/2010 | |
| TW | 201141063 | | 11/2011 | |

*Primary Examiner* — Yuzhen Shen
(74) *Attorney, Agent, or Firm* — WPAT, PC

(57) ABSTRACT

A shift register includes shift register units, in which at least one shift register unit is coupled to a forestage shift register unit and a post-stage shift register unit, where the at least one shift register unit includes a signal input circuit, a signal output circuit, a pull down circuit and a switching circuit. The signal input circuit electrically coupled to the forestage shift register unit can receive a logic signal from the forestage shift register. The signal output circuit is electrically coupled to the signal input circuit via a control signal terminal and is electrically coupled to the post-stage shift register unit. The signal output circuit can receive a first clock signal. The pull down circuit is electrically coupled to or electrically isolated from the control signal terminal through the switching circuit.

10 Claims, 4 Drawing Sheets

(51) Int. Cl.
*G11C 19/00* (2006.01)
*G09G 3/38* (2006.01)
*G11C 19/18* (2006.01)

(52) U.S. Cl.
CPC ............ *G11C 19/00* (2013.01); *G11C 19/184* (2013.01); *G09G 2310/0286* (2013.01)

(58) Field of Classification Search
USPC .......................................... 345/100, 204, 64
See application file for complete search history.

(56) References Cited

U.S. PATENT DOCUMENTS

| | | | |
|---|---|---|---|
| 7,310,402 B2 | 12/2007 | Wei et al. | |
| 7,929,658 B2 * | 4/2011 | Lin ........................ | G11C 19/28 377/64 |
| 8,019,039 B1 | 9/2011 | Tsai | |
| 2004/0189585 A1 | 9/2004 | Moon | |
| 2006/0001637 A1* | 1/2006 | Pak ...................... | G09G 3/3677 345/100 |
| 2008/0088559 A1 | 4/2008 | Lai et al. | |
| 2010/0164915 A1 | 7/2010 | Kim et al. | |
| 2010/0245298 A1 | 9/2010 | Chen et al. | |
| 2010/0316182 A1 | 12/2010 | Lai | |
| 2012/0170707 A1* | 7/2012 | Hsu ...................... | G09G 3/3677 377/79 |
| 2012/0188210 A1 | 7/2012 | Zhang et al. | |

\* cited by examiner

SHIFT REGISTER

RELATED APPLICATIONS

The present application is a continuation application of U.S. application Ser. No. 13/661,239, filed on Oct. 26, 2012, which claims priority to Taiwan Patent Application Serial Number 100144677, filed Dec. 5, 2011, all of which are herein incorporated by reference.

BACKGROUND

Technical Field

The present disclosure relates to electronic devices, and more particularly, shift registers.

Description of Related Art

Flat panel displays include various types of displays such as liquid crystal display (LCD), field emission display (FED), organic light-emitting diode (OLED) display and electronic paper (e-paper). Due to their characteristics of light weight, low power consumption, and minimal radiation, flat panel displays have gradually replaced conventional cathode ray tube (CRT) monitors used by desktop computers and have been widely applied in electronic devices such as notebooks, mobile phones, and televisions. Conventionally, a flat panel display is designed to have each of its pixel rows to be sequentially refreshed, and therefore, it requires a shift register to generate control signals that are sequentially refreshed based on the clock signal and other signals.

However, as the complexity of electronic devices increases, the condition for electrical circuit design is getting more and more stringent. For example, if the transmission of the clock signal is significantly delayed, abnormalities might occur in the shift register output which generates scan signals based on the clock signal.

In view of the foregoing, there exists problems and disadvantages in the current shift register techniques that await further improvement. However, persons of ordinary skill in the art sought vainly for a solution. In order to solve or circumvent aforementioned problems and disadvantages, there is an urgent need in the related field to provide a solution for preventing the output terminal of the shift register unit from being incapable of outputting a normal signal to the next stage unit.

SUMMARY

The following presents a simplified summary of the disclosure in order to provide a basic understanding to the reader. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

In one or more various aspects, the present disclosure is directed to a flat panel display, a shift register and a method of controlling the shift register, for solving or circumventing above-mentioned problems and disadvantages.

According to one embodiment of the present disclosure, a shift register includes shift register units, in which at least one shift register unit is coupled to a forestage shift register unit and a post-stage shift register unit, where the at least one shift register unit includes a signal input circuit, a signal output circuit, a pull down circuit and a switching circuit. The signal input circuit is electrically coupled to the forestage shift register unit for receiving a logic signal from the forestage shift register. The signal output circuit is electrically coupled to the signal input circuit and the post-stage shift register unit for receiving a first clock signal, wherein the signal output circuit is electrically coupled to the signal input circuit via a control signal terminal. The pull down circuit is electrically coupled to the signal input circuit and the signal output circuit for receiving a first operation voltage to pull down a voltage of the control signal terminal. The pull down circuit is electrically coupled to the control signal terminal via the switching circuit.

According to another embodiment of the present disclosure, a flat panel display includes a plurality of pixels, a plurality of data lines, a plurality of scan lines and above-mentioned shift register. The data lines are electrically coupled to the pixels respectively for transmitting pixel voltage to drive the pixels. The scan lines are interlaced with the data lines and are electrically coupled to the pixels for updating the pixels. The shift register units are electrically coupled to the scan lines for generating a plurality of scanning signals to update the pixels.

According to yet another embodiment of the present disclosure, a method is to control a shift register, the shift register includes a plurality of shift register units, at least one of the shift register units includes a signal input circuit, a signal output circuit and a pull down circuit, and the signal output circuit is electrically coupled to the signal input circuit via a control signal terminal for receiving a first clock signal. The method includes steps as follows. A logic signal is received from a forestage shift register through the signal input circuit. A control voltage of the control signal terminal is generated through the signal input circuit. An output signal is generated through the signal output circuit. The control voltage of the control signal terminal is pulled down through the pull down circuit. When the first clock signal and a second clock signal received by the forestage shift register unit both are at a logic low level, the control signal terminal is electrically isolated from the pull down circuit Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawing, wherein.

DETAILED DESCRIPTION

Figure 1:
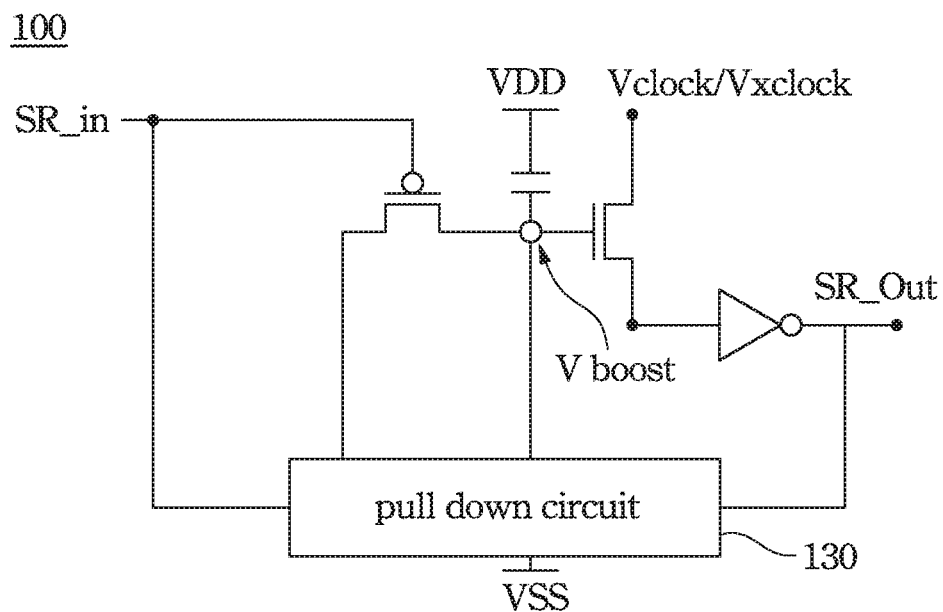
FIG. 1 shows a shift register unit for driving a scan line on a low temperature poly-silicon panel.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one aspect, the present disclosure is directed to a shift register. This shift register may be easily applied into a flat panel display, and may be applicable or readily adaptable to all related technology. It should be noted that the present disclosure can be used for preventing abnormal discharge of shift register units. For a more complete understanding of the shift register, and the advantages thereof, please refer to Figures and embodiments of the present disclosure.

FIG. 1 shows a shift register unit 100 for driving a scan line on a low temperature poly-silicon panel. When an input terminal (SR_in) is at a logic low level (Vgl), the control signal terminal (Vboost) is boosted up to a logic high level (Vgh); at the moment, a clock signal (Vclock) of the current stage is at the logic high level (Vgh). Clock signals (Vclock/Vxclock) and an output terminal (SR_out) are shown as below in Table 1:

TABLE 1

| Vclock | Vxclock | SR_out |
|--------|---------|--------|
| Vgl | Vgh | Normal |
| Vgh | Vgl | Normal |
| Vgl | Vgl | Abnormal |
| Vgh | Vgh | Normal |

Figure 2:
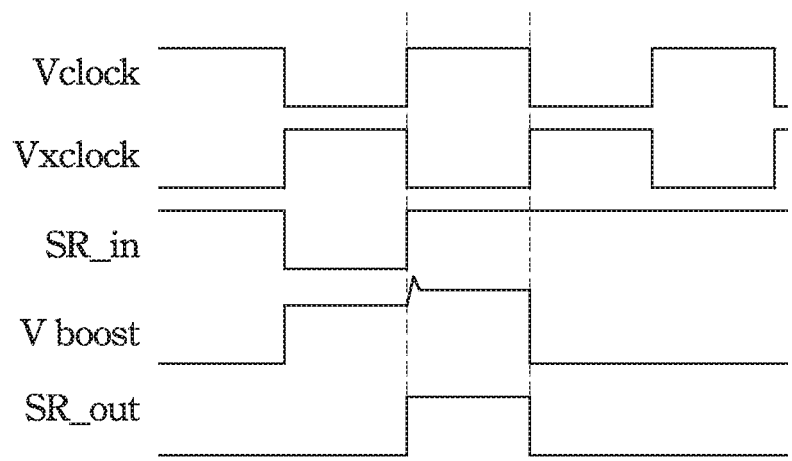
FIG. 2 is a timing diagram of the shift register unit of FIG. 1 in a normal state.
Figure 3:
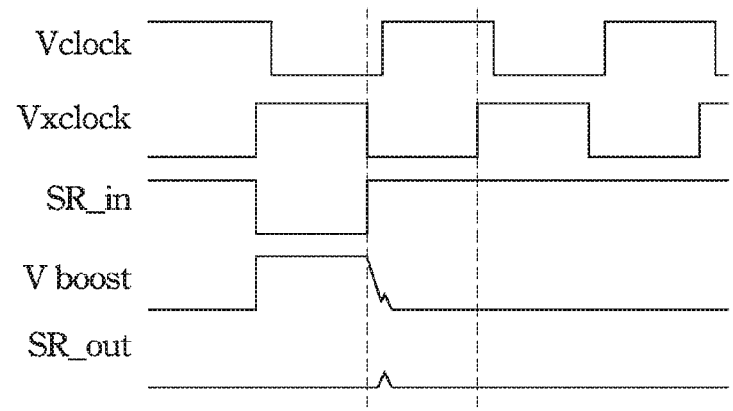
FIG. 3 is a timing diagram of the shift register unit of FIG. 1 in an abnormal state.

Due to a capacitance effect, the control signal terminal (Vboost) can be further boosted to and maintained at the logic high level. When the output terminal (SR_out) of the current stage outputs a normal signal to drive the scan line, this signal is also transmitted to a post-stage shift register unit, and the post-stage shift register unit receives a clock signal (Vxclock) that is at the logic low level (Vgl). When the shift register unit 100 is at the logic high level (Vgh), the operation can be deduced by analogy, as shown in FIG. 2. When the shift register unit 100 operates normally, the clock signal (Vclock/Vxclock) of the current stage must be at the logic high level (Vgh). On the contrary, when the clock signals (Vclock, Vxclock) of the current shift register unit cannot arrive at the logic high level as shown in FIG. 3, and furthermore when the clock signal (Vxclock) of the forestage shift register unit is dropped to the logic low level, these two clock signals (Vclock, Vxclock) are at a logic low level, so that a pull down circuit 130 of the shift register unit 100 can pull down the control signal terminal (Vboost) to the logic low level. In this way, the output terminal (SR_out) cannot output the normal signal to the post-stage shift register unit, and therefore the operation is abnormal.

Figure 4:
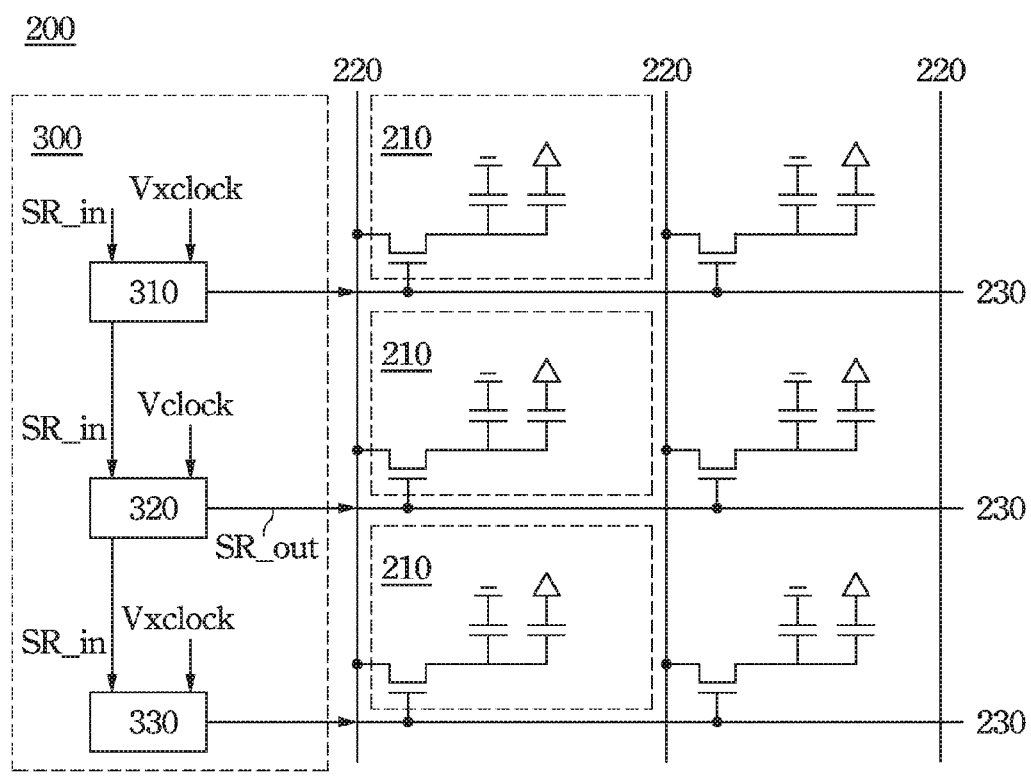
FIG. 4 is a schematic diagram of a flat panel display according to one embodiment of the present disclosure.

FIG. 4 is a schematic diagram of a flat panel display 200 according to one embodiment of the present disclosure. As shown in FIG. 4, the flat panel display 200 includes a plurality of pixels 210, a plurality of data lines 220, a plurality of scan lines 230 and a shift register 300. The data lines 220 are electrically coupled to the pixels 210 respectively for transmitting pixel voltage to drive the pixels 210. The scan lines 230 are interlaced with the data lines 220 and are electrically coupled to the pixels 210 for updating the pixels 210. The shift register units are electrically coupled to the scan lines for generating a plurality of scanning signals to update the pixels.

The shift register 300 includes shift register units 310, 320 and 330. The register units 310, 320 and 330 are electrically coupled to the corresponding scan lines 230 respectively generating a plurality of scanning signals to update the pixels 210. The shift register units 310, 320 and 330 alternately receives a first clock signal (Vclock) and a second clock signal (Vxclock); when the shift register unit 310 receives the second clock signal (Vxclock), the post-stage shift register unit 320 receives the first clock signal (Vclock), and the next post-stage shift register unit 330 receives the second clock signal (Vxclock). In this embodiment, a phase difference between the first clock signal (Vclock) and the second clock signal (Vxclock) is non-zero; for example, the first clock signal (Vclock) and the second clock signal (Vxclock) are set to be anti-phase. In this way, flat panel display 200 can operates in normal.

Figure 5:
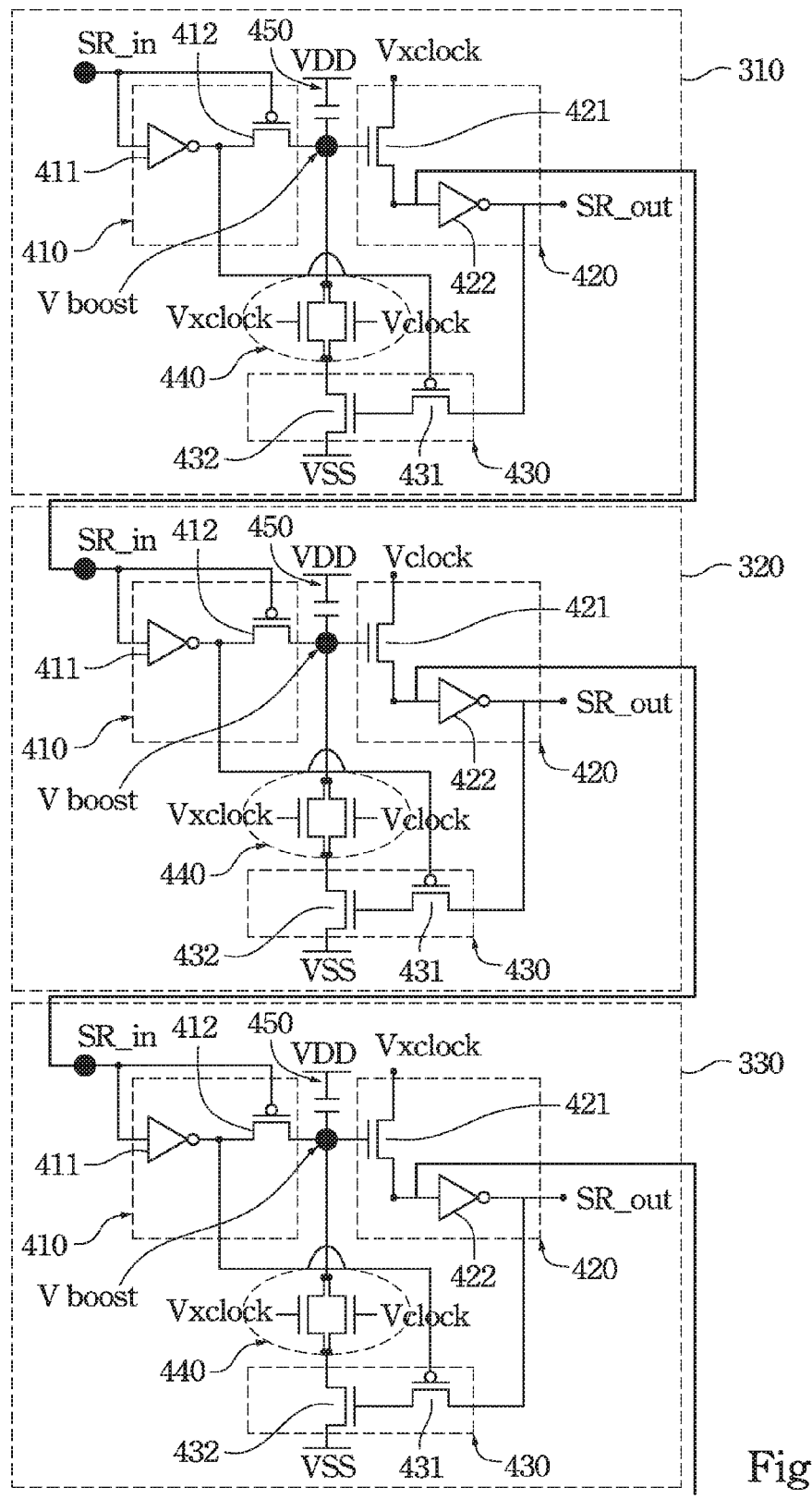
FIG. 5 is a circuit diagram of shift register units according to one embodiment of the present disclosure.

For a more complete understanding of the shift register units, and the advantages thereof, refer to FIG. 5. FIG. 5 is a circuit diagram of the shift register units according to one embodiment of the present disclosure. In this embodiment, the shift register unit 320 is described for illustrative purposes only, and this description is not intended to be limited to the particular embodiment. In practice, the shift register units each can have the same or similar structure. Those with ordinary skill in the art may flexibly design the shift register units depending on the desired application.

The shift register unit 320 is electrically coupled to a forestage shift register unit 310 and a post-stage shift register unit 330, where the shift register unit 320 includes a signal input circuit 410, a signal output circuit 420, a pull down circuit 430 and a switching circuit 440. The signal input circuit 410 is electrically coupled to the forestage shift register unit 310 for receiving a logic signal from the forestage shift register 310 via an input terminal (SR_in). The signal output circuit 420 is electrically coupled to the signal input circuit 410 and the post-stage shift register unit 330 for receiving a first clock signal (Vclock), wherein the signal output circuit 420 is electrically coupled to the signal input circuit 410 via a control signal terminal (Vboost). The pull down circuit 430 is electrically coupled to the signal input circuit 410 and the signal output circuit 420 for receiving a first operation voltage (VSS) to pull down a voltage of the control signal terminal (Vboost). The switching circuit 440 is electrically coupled to the pull down circuit 430 and the control signal terminal (Vboost). The pull down circuit 430 can be selectively electrically coupled to or isolated from the control signal terminal (Vboost) through the switching circuit 440.

Regarding above electrically coupling or isolation between the pull down circuit 430 and the control signal terminal (Vboost), Table 2 is referred as below:

TABLE 2

| Vclock | Vxclock | SR_out |
|--------|---------|--------|
| Vgl    | Vgh     | Normal |
| Vgh    | Vgl     | Normal |
| Vgl    | Vgl     | Normal |
| Vgh    | Vgh     | Normal |

When the first clock signal (Vclock) and a second clock signal (Vxclock) received by the forestage shift register unit 310 both are at a logic low level, the switching circuit 440 electrically isolates the control signal terminal (Vboost) and the pull down circuit 430. In this way, the pull down circuit 430 cannot pull down the control signal terminal (Vboost) to the logic low level, so as to prevent abnormal discharge of the shift register unit 320.

When any one of the first clock signal (Vclock) and the second clock signal (Vxclock) is at a logic high level, the switching circuit 440 electrically couples the control signal terminal (Vboost) and the pull down circuit 430. In this way, the shift register unit 320 can operate normally.

The switching circuit 440 includes a pair of transistors, in which each of the transistors includes a first terminal, a second terminal and a gate terminal. The first terminals of the pair of transistors are electrically coupled to the control signal terminal (Vboost), the second terminals of the pair of transistors are electrically coupled to the pull down circuit 430, and the gate terminals of the pair of transistors receive the first clock signal (Vclock) and the second clock signal (Vxclock) respectively. In use, the gate terminal of one transistor can be turned on/off by the first clock signal (Vclock), and the gate terminal of another transistor can be turned on/off by the second clock signal (Vxclock). When the first clock signal (Vclock) and the second clock signal (Vxclock) both are at a logic low level, the switching circuit 440 is turned off. In this embodiment, only two transistors can constitute the switching circuit 440, so as to reduce cost and improve density.

Figure 6:
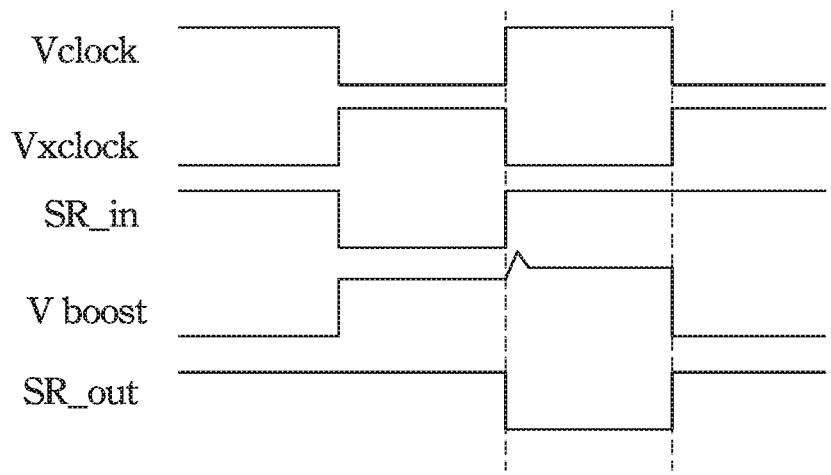
FIG. 6 is a timing diagram of the shift register unit of FIG. 5.

The signal input circuit 410 includes a first inverter 411 and a first transistor 412. The first inverter 411 has an input terminal (SR_in) for receiving the logic signal from the forestage shift register 310. The first transistor 412 has a gate, a first terminal and a second terminal. The gate of the first transistor 412 is electrically coupled to the input terminal (SR_in) of the first inverter 411, the first terminal of the first transistor 412 is electrically coupled to an output terminal of the first inverter 411, and the second terminal of the first transistor 412 is electrically coupled to the control signal terminal (Vboost). In use, the signal input circuit 410 receives the logic signal from the forestage shift register 310, and signal input circuit 410 generates control voltage for the control signal terminal (Vboost), as shown in FIG. 6. In this embodiment, the first transistor 412 is a first p-type metal oxide semiconductor (PMOS) transistor, and the first inverter 411 can improve signal transmissions.

The signal output circuit 420 includes a second transistor 421 and a second inverter 422. The second transistor 421 has a gate, a first terminal and a second terminal. The gate of the second transistor 421 is electrically coupled to the control signal terminal (Vboost), the first terminal of the second transistor 421 is configured to receive the first clock signal (Vclock), and the second terminal of the second transistor 421 is electrically coupled to the post-stage shift register unit 330. The second inverter 422 has an input terminal and an output terminal. The input terminal of the second inverter 422 is electrically coupled to the second terminal of the second transistor 421, and the output terminal (SR_out) of the second inverter 422 is electrically coupled to the pull down circuit 430. In use, the signal output circuit 420 can generate an output signal, as shown in FIG. 6. In this embodiment, the second transistor 421 is a first n-type metal oxide semiconductor (NMOS) transistor, and the second inverter 422 can improve signal transmissions.

The pull down circuit 430 includes a third transistor 431 and a fourth transistor 432. The third transistor 431 has a gate, a first terminal and a second terminal. The gate of the third transistor 431 is electrically coupled to the input terminal of the first inverter 411, and the first terminal of the third transistor 431 is electrically coupled to the output terminal of the second inverter 422. The fourth transistor 432 has a gate, a first terminal and a second terminal. The gate of the fourth transistor 432 is electrically coupled to the second terminal of the third transistor 431, the first terminal of the fourth transistor 432 is electrically coupled to the first operation voltage (VSS), and the second electrically of the fourth transistor 432 is coupled to the switching circuit 440. In use, the pull down circuit 430 can pull down the control voltage of the control signal terminal (Vboost), as shown in FIG. 6. In this embodiment, the third transistor 431 is a second PMOS transistor, and the fourth transistor 432 is a second NMOS transistor.

The shift register unit 320 may further include a capacitor 450. The capacitor 450 has a first terminal and a second terminal. The first terminal of the capacitor 450 is electrically coupled to a second operation voltage (VDD), and the second terminal of the capacitor 450 is electrically coupled to the control signal terminal (Vboost). In use, the capacitor 450 can be used for charging.

In another aspect, the present disclosure is directed to a method for controlling a shift register, such as the aforementioned shift register 300. The shift register 300 includes a plurality of shift register units 310, 320 and 330, at least one shift register unit (e.g., 320) includes a signal input circuit 410, a signal output circuit 420 and a pull down circuit 430, and the signal output circuit 420 is electrically coupled to the signal input circuit 410 via a control signal terminal (Vboost) for receiving a first clock signal (Vclock). The method includes steps as follows (The steps are not recited in the sequence in which the steps are performed. That is, unless the sequence of the steps is expressly indicated, the sequence of the steps is interchangeable, and all or part of the steps may be simultaneously, partially simultaneously, or sequentially performed): a logic signal is received from a forestage shift register 310 through the signal input circuit 410; a control voltage of the control signal terminal (Vboost) is generated through the signal input circuit 410; an output signal is generated through the signal output circuit 420 controlled by the control voltage of the control signal terminal (Vboost); the control voltage of the control signal terminal (Vboost) is pulled down through the pull down circuit 430, in which when the first clock signal (Vclock) and a second clock signal (Vxclock) received by the forestage shift register unit 310 both are at a logic low level, the control signal terminal (Vboost) is electrically isolated from the pull down circuit 430.

In this method, when any one of the first clock signal (Vclock) and the second clock signal (Vxclock) is at a logic high level the control signal terminal (Vboost) is electrically coupled to the pull down circuit 430.

Figure 7:
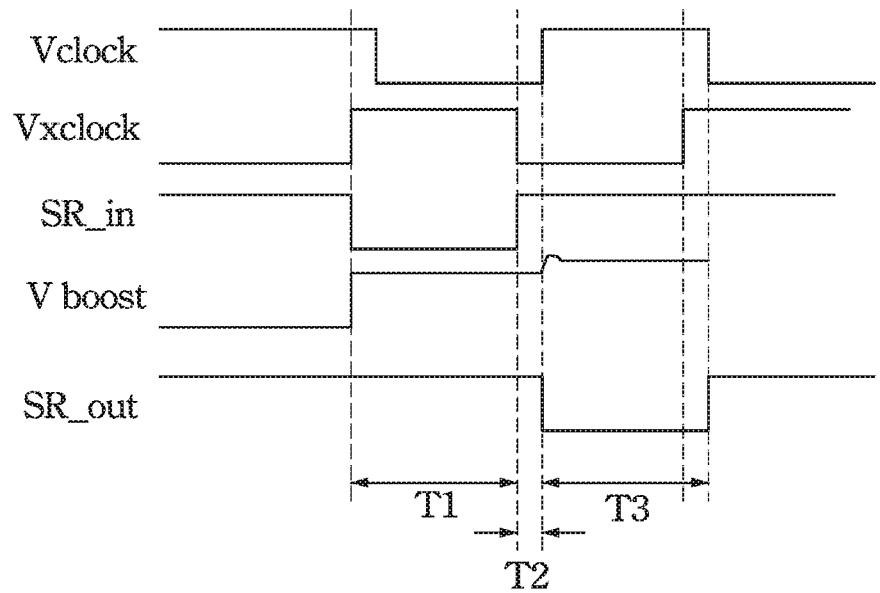
FIG. 7 is a timing diagram of a clock delay of the shift register unit of FIG. 5.

Referring to FIG. 7, FIG. 7 is a timing diagram of a clock delay of the shift register unit of FIG. 5. Compared with FIG. 6, a phase difference between the first clock signal (Vclock) and the second clock signal (Vxclock) is not 180 degree as shown in FIG. 7. In the period T3, if the shift register of FIG. 1 were utilized, the abnormal output would occur as shown in FIG. 3. However, when the first clock signal (Vclock) and a second clock signal (Vxclock) received by the forestage shift register unit 310 both are at a logic low level, the control signal terminal (Vboost) is electrically isolated from the pull down circuit 430, so as to prevent failure.

Refer to the timing diagram of FIG. 7 and the circuitry of FIG. 5. Before the period T1, the signal of the control signal terminal (Vboost) is at the logic low level. In the period T1, the input terminal (SR_in) of the signal input circuit 410 receives the logic signal of the forestage shift register unit 310, in which the logic signal is changed form the logic high level to the logic low level, and therefore the first transistor 412 is turned on so that the control voltage of the control signal terminal (Vboost) can be boosted up to the logic high level to turn on the second transistor 421. Therefore, the first clock signal (Vclock) can be transmitted to the post-stage shift register unit 330 and the second inverter 422; at the moment, the output signal of the output terminal (SR_out) is at the logic high level.

In the period T2, the input terminal (SR_in) receives the logic signal of the forestage shift register unit 310 in which the logic signal is changed form the logic low level to the logic high level, so as to turn on the third transistor 431; the fourth transistor 432 is turned on because of the logic high level of the output terminal (SR_out). However, when the first clock signal (Vclock) and a second clock signal (Vxclock) both are at the logic low level, the switching circuit 440 electrically isolates the control signal terminal (Vboost) and the pull down circuit 430, so as to prevent the voltage level of the control signal terminal (Vboost) from being pulled down by the pull down circuit 430.

In the period T3, the first clock signal (Vclock) is changed form the logic low level to the logic high level. Due to a capacitance effect, the control voltage of the control signal terminal (Vboost) can be further boosted to improve the turn-on state of the second transistor 421. The output signal of the output terminal (SR_out) is changed to the logic low level because the first clock signal (Vclock) is changed form the logic low level to the logic high level.

After the period T3, the first clock signal (Vclock) is changed form the logic high level to the logic low level, so that the output signal of the output terminal (SR_out) is changed to the logic high level for turning on the fourth transistor 432. Since the first clock signal (Vclock) is at the logic high level, the control signal terminal (Vboost) is electrically coupled to the pull down circuit 430, so that the pull down circuit 430 can pull down the control signal terminal (Vboost).

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A shift register comprising:
   a plurality of shift register units, wherein at least one shift register unit is coupled to a forestage shift register unit and a post-stage shift register unit, and the at least one shift register unit comprises:
   a signal input circuit electrically coupled to the forestage shift register unit and configured for receiving a logic signal from the forestage shift register;
   a signal output circuit electrically coupled to the signal input circuit and the post-stage shift register unit and configured for receiving a first clock signal, wherein the signal output circuit is electrically coupled to the signal input circuit via a control signal terminal;
   a pull down circuit electrically coupled to the signal input circuit and the signal output circuit and configured for receiving a first operation voltage to pull down a voltage of the control signal terminal; and
   a switching circuit, wherein the pull down circuit is electrically coupled to the control signal terminal via the switching circuit;
   wherein the pull down circuit comprises:
   a first transistor having a gate electrically coupled to the signal input circuit, a first terminal electrically coupled to the signal output circuit and configured to receive a output signal of the signal output circuit, and a second terminal, wherein the gate, the first terminal and the second terminal of the first transistor are three different nodes of the first transistor; and
   a second transistor having a gate electrically coupled to the second terminal of the first transistor to control the second transistor to turn on or turn off according to a voltage level of the second terminal of the first transistor, a first terminal configured to receive the first operation voltage, and a second terminal electrically coupled to the switching circuit and configured to pull down the voltage of the control signal terminal through a conductive path of the switching circuit, wherein the gate, the first terminal and the second terminal of the second transistor are three different nodes of the second transistor.

2. The shift register of claim 1, wherein when the first clock signal received by the signal output circuit of the at least one shift register unit and a second clock signal received by the forestage shift register unit both are at a logic low level, the switching circuit electrically isolates the control signal terminal and the pull down circuit.

3. The shift register of claim 2, wherein when either one of the first clock signal and the second clock signal is at a logic high level, the switching circuit electrically couples the control signal terminal and the pull down circuit.

4. The shift register of claim 3, wherein the switching circuit comprises a pair of transistors, each of the pair of transistors is connected to the second transistor of the pull down circuit in series and between the pull down circuit and the control signal terminal, each of the transistors comprises a first terminal, a second terminal and a gate terminal, the first terminals of the pair of transistors are electrically coupled to the control signal terminal, the second terminals of the pair of transistors are electrically coupled to the pull down circuit, and the gate terminals of the pair of transistors receive the first clock signal and the second clock signal respectively.

5. The shift register of claim 1, wherein at a first time while the first clock signal received by the signal output circuit of the at least one shift register unit and a second clock signal received by the forestage shift register unit both are at a logic low level, the switching circuit electrically isolates the control signal terminal and the pull down circuit; and at a second time while either one of the first clock signal and the second clock signal is at a logic high level, the switching circuit electrically couples the control signal terminal and the pull down circuit.

6. The shift register of claim 1, wherein the signal input circuit comprises:
a first inverter having an input terminal for receiving the logic signal from the forestage shift register; and
a third transistor having a gate electrically coupled to the input terminal of the first inverter, a first terminal electrically coupled to an output terminal of the first inverter, and a second terminal electrically coupled to the control signal terminal.

7. The shift register of claim 6, wherein the signal output circuit comprises:
a fourth transistor having a gate electrically coupled to the control signal terminal, a first terminal for receiving the first clock signal, and a second terminal electrically coupled to the post-stage shift register unit; and
a second inverter having an input terminal electrically coupled to the second terminal of the fourth transistor, and an output terminal electrically coupled to the pull down circuit.

8. The shift register of claim 7, wherein the gate of the first transistor is electrically coupled to the input terminal of the first inverter, and the first terminal of the first transistor is electrically coupled to the output terminal of the second inverter.

9. The shift register of claim 1, wherein the at least one shift register unit further comprises:

a capacitor having a first terminal electrically coupled to a second operation voltage, and a second terminal electrically coupled to the control signal terminal.

10. A shift register comprising:
a plurality of shift register units, wherein at least one shift register unit is coupled to a forestage shift register unit and a post-stage shift register unit, and the at least one shift register unit comprises:
a signal input circuit electrically coupled to the forestage shift register unit and configured for receiving a logic signal from the forestage shift register;
a signal output circuit electrically coupled to the signal input circuit and the post-stage shift register unit and configured for receiving a first clock signal, wherein the signal output circuit is electrically coupled to the signal input circuit via a control signal terminal;
a pull down circuit electrically coupled to the signal input circuit and the signal output circuit and configured for receiving a first operation voltage to pull down a voltage of the control signal terminal; and
a switching circuit, wherein the pull down circuit is electrically coupled to the control signal terminal via the switching circuit;
wherein the switching circuit comprises a pair of transistors, each of the pair of transistors is connected to a second transistor of the pull down circuit in series and between the pull down circuit and the control signal terminal;
wherein the signal input circuit comprises:
a first inverter having an input terminal for receiving the logic signal from the forestage shift register; and
a first transistor having a gate electrically coupled to the input terminal of the first inverter, a first terminal electrically coupled to an output terminal of the first inverter, and a second terminal electrically coupled to the control signal terminal;
wherein the signal output circuit comprises:
a second transistor having a gate electrically coupled to the control signal terminal, a first terminal for receiving the first clock signal, and a second terminal electrically coupled to the post-stage shift register unit; and
a second inverter having an input terminal electrically coupled to the second terminal of the second transistor, and an output terminal electrically coupled to the pull down circuit;
wherein the pull down circuit comprises:
a third transistor having a gate electrically coupled to the input terminal of the first inverter, a first terminal electrically coupled to the output terminal of the second inverter, and a second terminal; and
a fourth transistor having a gate electrically coupled to the second terminal of the third transistor, a first terminal electrically coupled to the first operation voltage, and a second terminal electrically coupled to the switching circuit.

* * * * *